US012712496B2

(12) United States Patent
Nakamoto

(10) Patent No.: US 12,712,496 B2
(45) Date of Patent: Aug. 18, 2026

(54) AMPLIFIER CIRCUIT

(71) Applicant: SONY SEMICONDUCTOR SOLUTIONS CORPORATION, Kanagawa (JP)

(72) Inventor: Eiichi Nakamoto, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 425 days.

(21) Appl. No.: 18/574,186

(22) PCT Filed: Feb. 10, 2022

(86) PCT No.: PCT/JP2022/005298

§ 371 (c)(1),
(2) Date: Dec. 26, 2023

(87) PCT Pub. No.: WO2023/281791

PCT Pub. Date: Jan. 12, 2023

(65) Prior Publication Data

US 2024/0322765 A1 Sep. 26, 2024

(30) Foreign Application Priority Data

Jul. 8, 2021 (JP) ................................ 2021-113811

(51) Int. Cl.
*H03F 3/45* (2006.01)
*H03F 3/183* (2006.01)

(52) U.S. Cl.
CPC ......... *H03F 3/183* (2013.01); *H03F 2200/03* (2013.01)

(58) Field of Classification Search
CPC ........................................................ H03F 3/45

(Continued)

(56) References Cited

U.S. PATENT DOCUMENTS

2007/0109049 A1 5/2007 Wu
2007/0146069 A1 6/2007 Wu et al.
2007/0279126 A1 12/2007 Krishnan et al.

FOREIGN PATENT DOCUMENTS

JP 2016127483 A 7/2016

OTHER PUBLICATIONS

International Search Report & English Translation from corresponding International Patent Application No. PCT/JP2022/005298, mailed May 17, 2022. 5 pages.

(Continued)

*Primary Examiner* — Henry Choe
(74) *Attorney, Agent, or Firm* — K&L Gates LLP

(57) ABSTRACT

An amplifier circuit of the present disclosure includes: an input circuit that is configured to generate a differential current including a first current and a second current on the basis of an input signal; a first loop filter including a first former-stage integration circuit, a first inverter circuit, and a first latter-stage integration circuit, the first former-stage integration circuit configured to perform an integral action on the basis of the first current and a current corresponding to a first output signal, and the first latter-stage integration circuit that is configured to generate a first signal by receiving an output signal of the first inverter circuit and the first output signal and performing an integral action; a first modulation circuit; a first output circuit; a second loop filter including a second former-stage integration circuit, a second inverter circuit, and a second latter-stage integration circuit, the second former-stage integration circuit that receives the second current and a current corresponding to a second output signal and is configured to perform an integral action, and the second latter-stage integration circuit configured to generate a second signal by performing an integral action on the basis of an output signal of the second inverter circuit (Continued)

and the second output signal; a second modulation circuit; and a second output circuit.

5 Claims, 10 Drawing Sheets

(58) Field of Classification Search
USPC .......................................................... 330/260
See application file for complete search history.

(56) References Cited

OTHER PUBLICATIONS

Written Opinion from corresponding International Patent Application No. PCT/JP2022/005298, mailed May 17, 2022. 3 pages.

[FIG. 1]
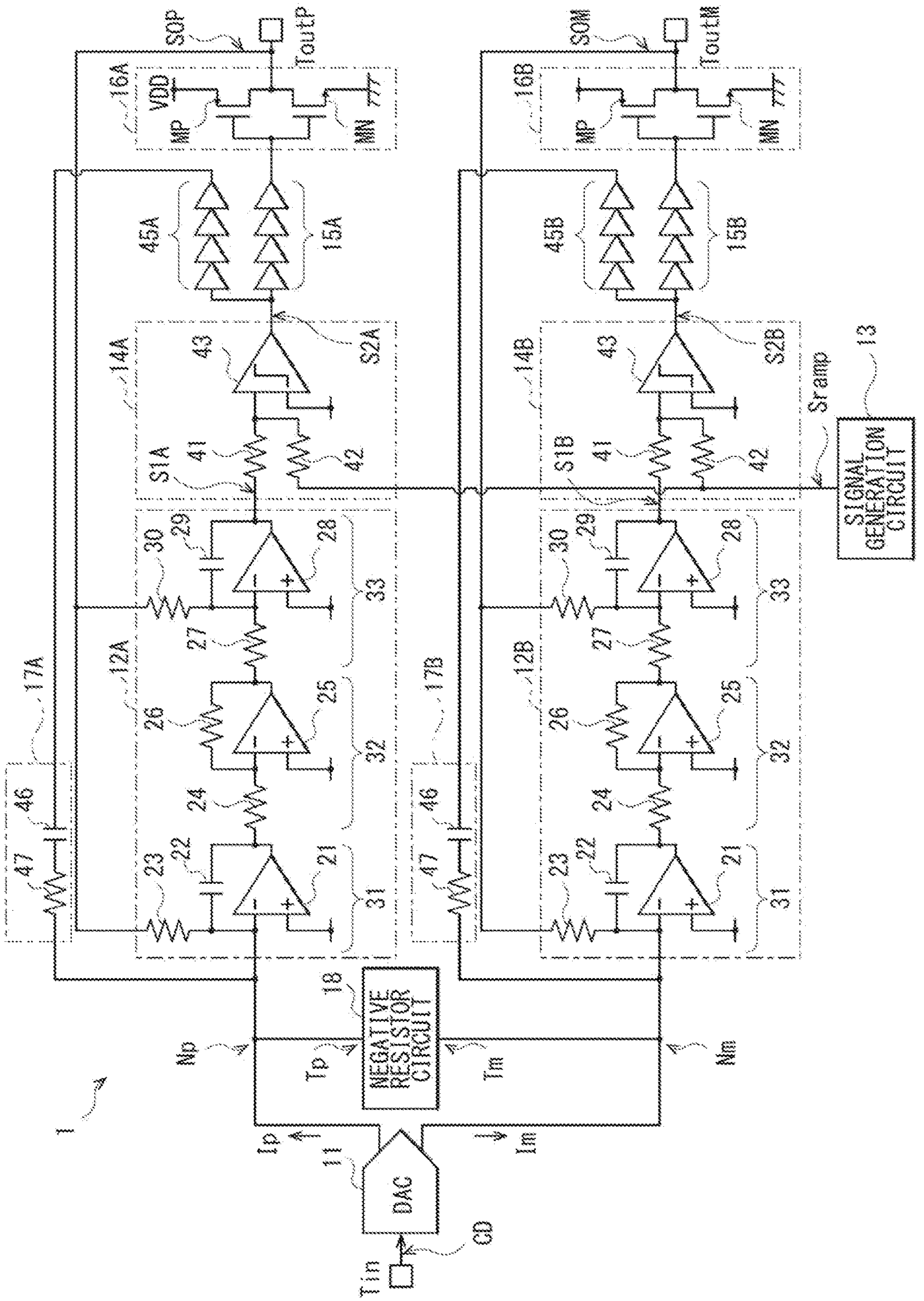

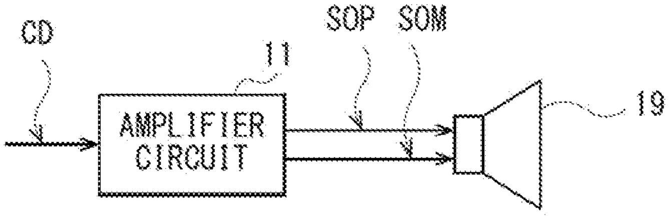
[ FIG. 2 ]
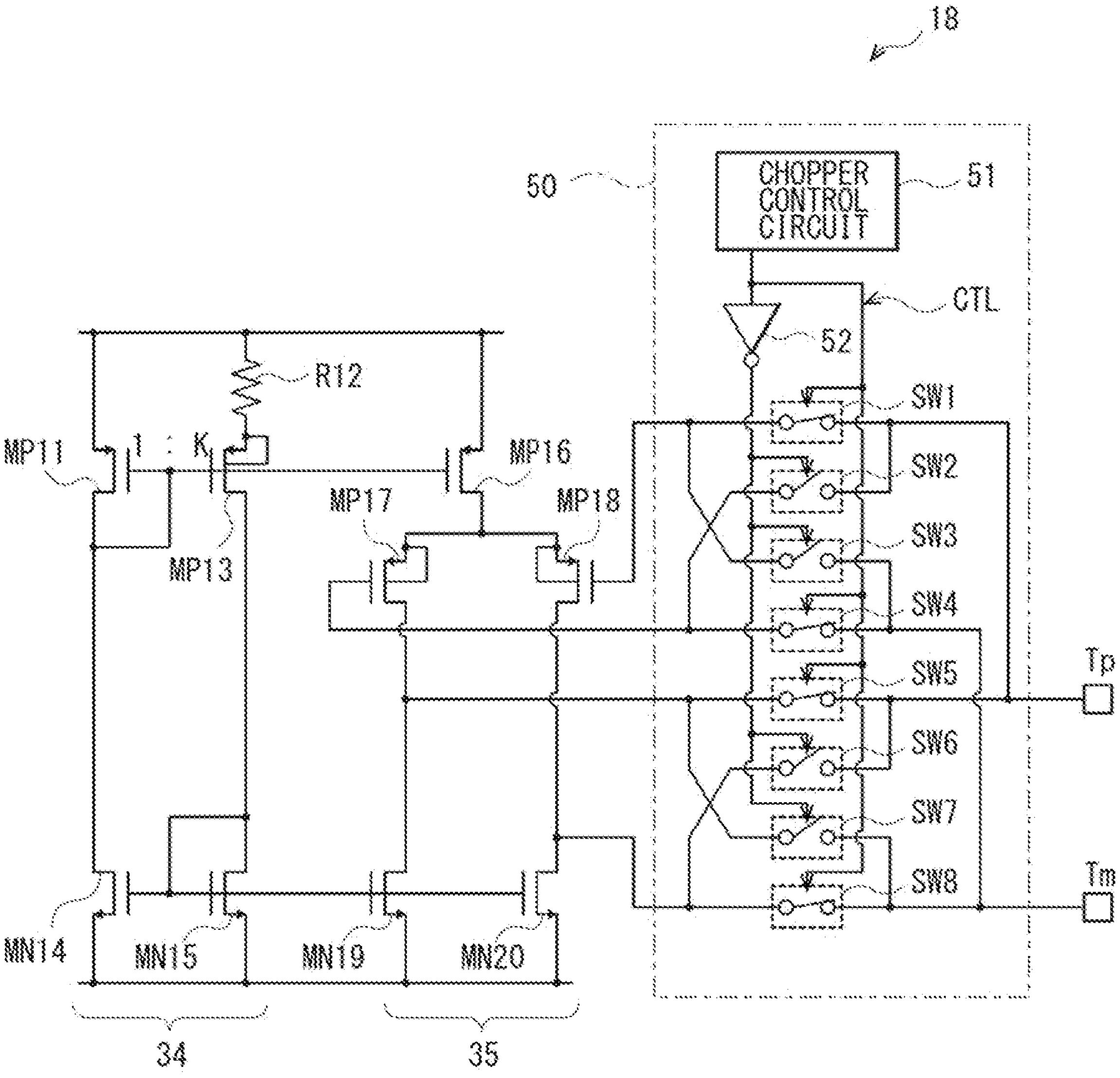
[ FIG. 3 ]
18
50
CHOPPER CONTROL CIRCUIT
51
CTL
52
R12
MP11
1 : K
MP16
MP17
MP18
MP13
SW1
SW2
SW3
SW4
SW5
SW6
SW7
SW8
Tp
Tm
MN14
MN15
MN19
MN20
34
35

[FIG. 4]
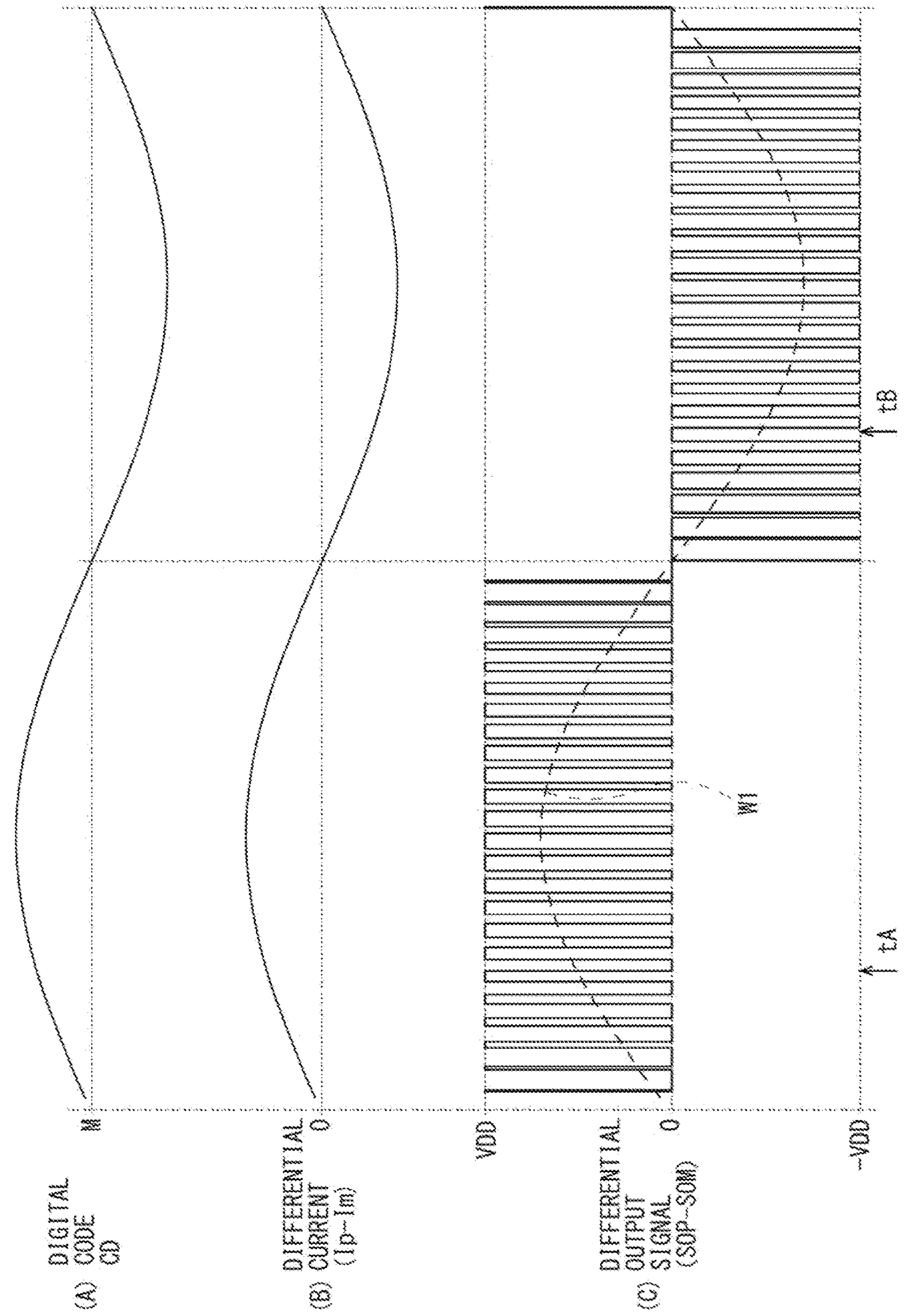

[ FIG. 5 ]
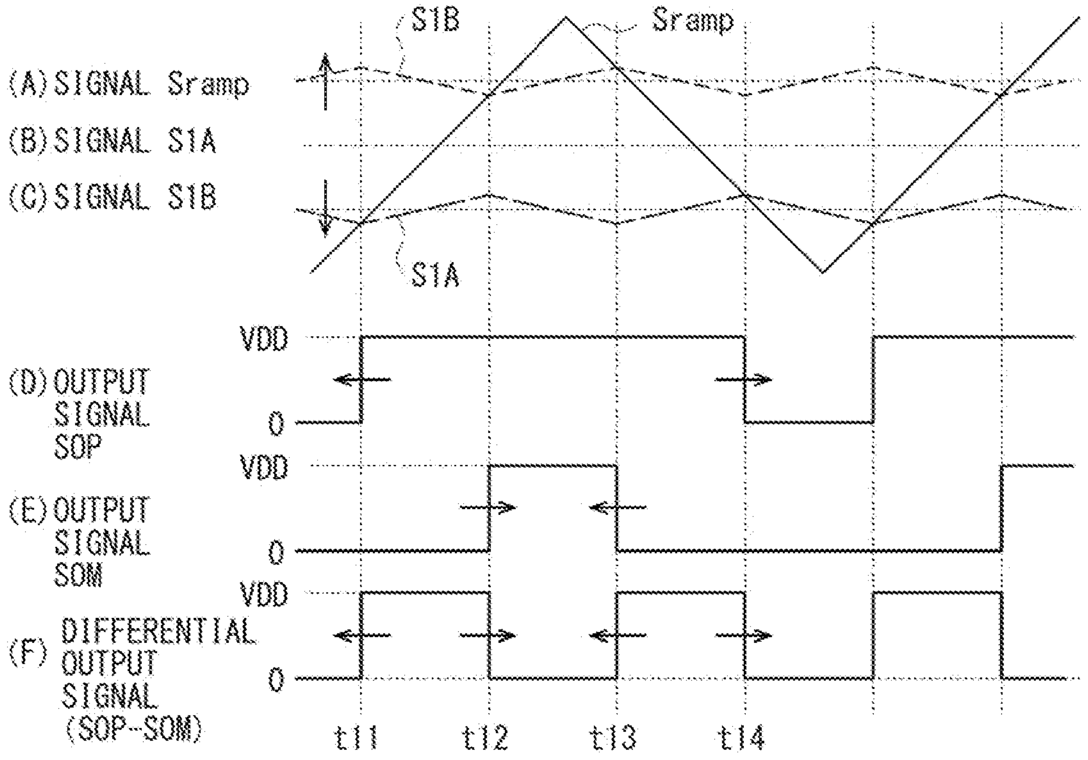
[ FIG. 6 ]
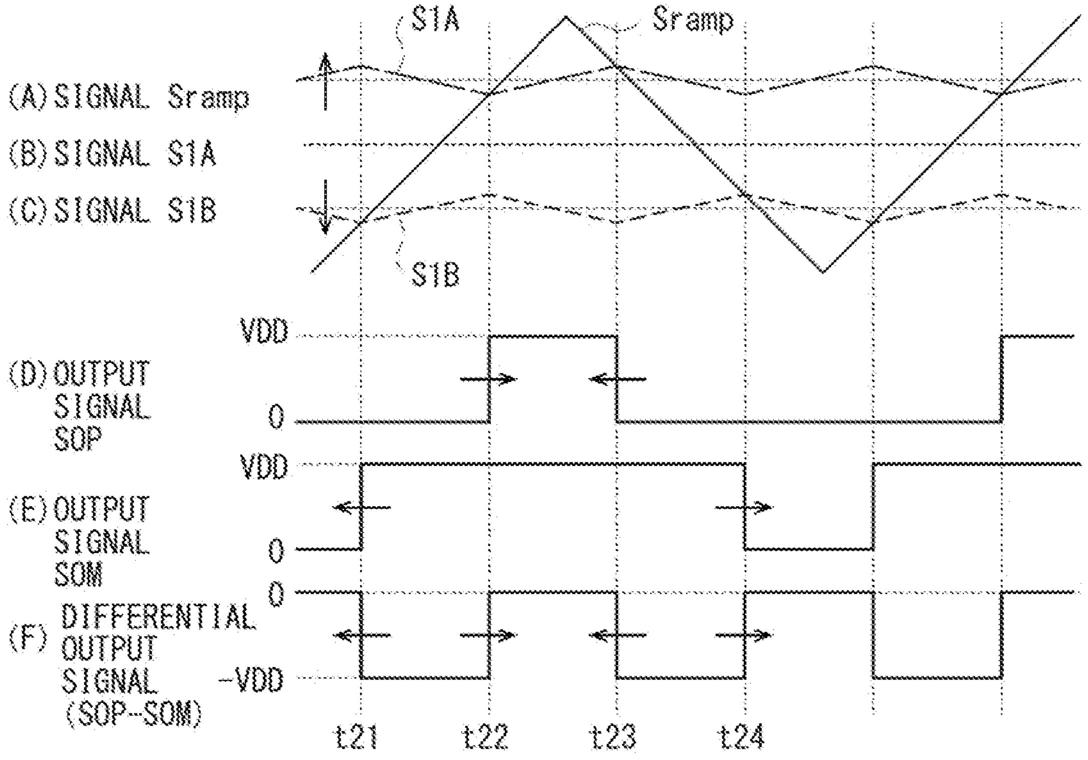

[ FIG. 7 ]
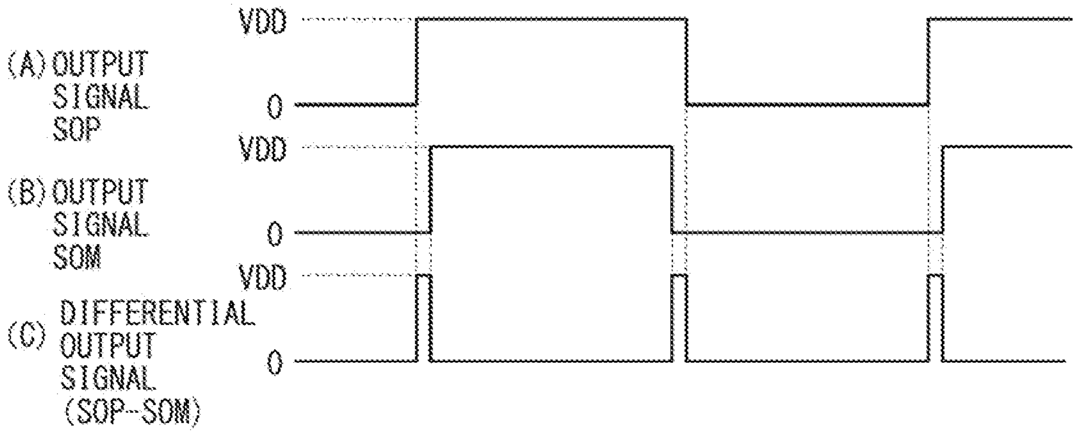
[ FIG. 8 ]
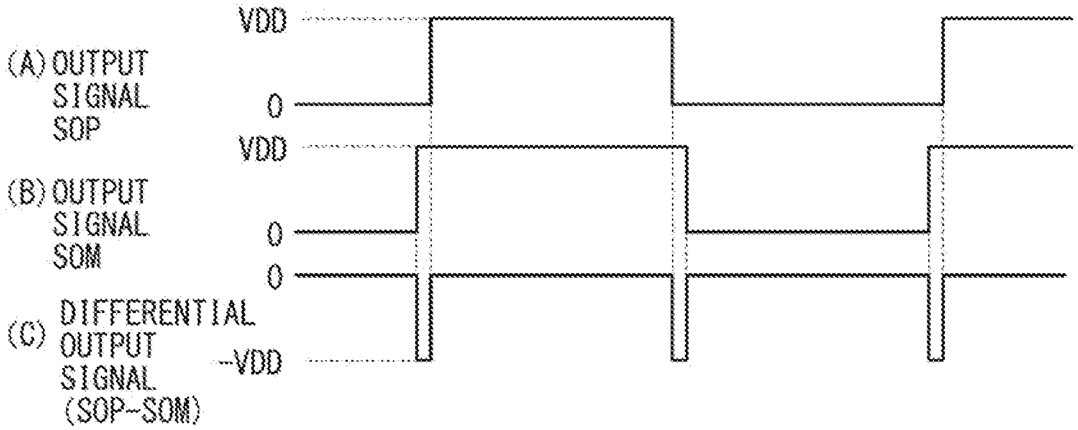

[ FIG. 9 ]
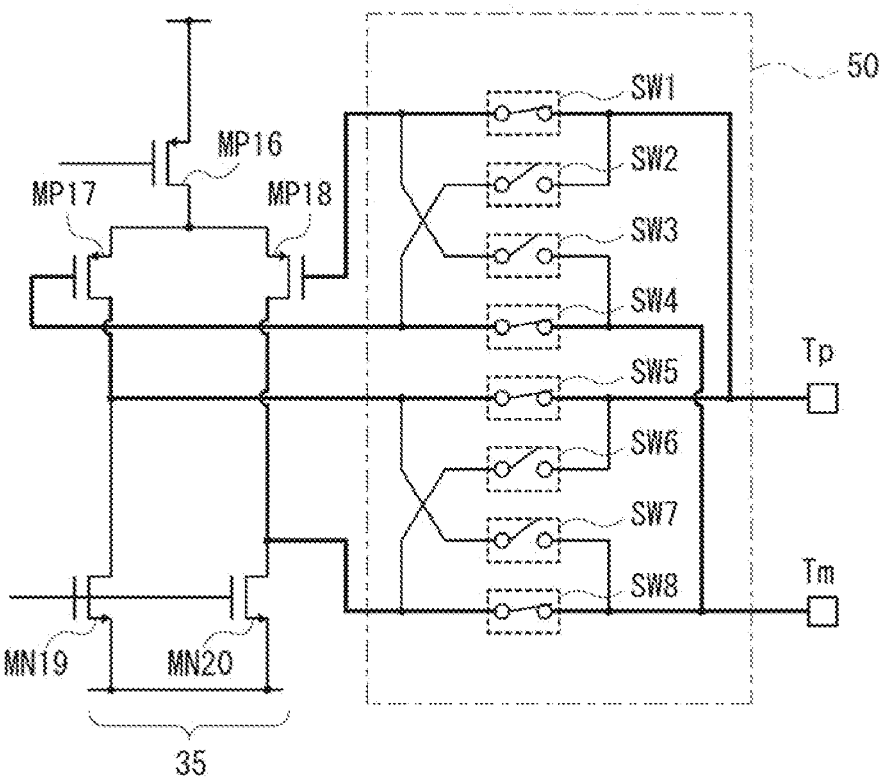
[ FIG. 10 ]
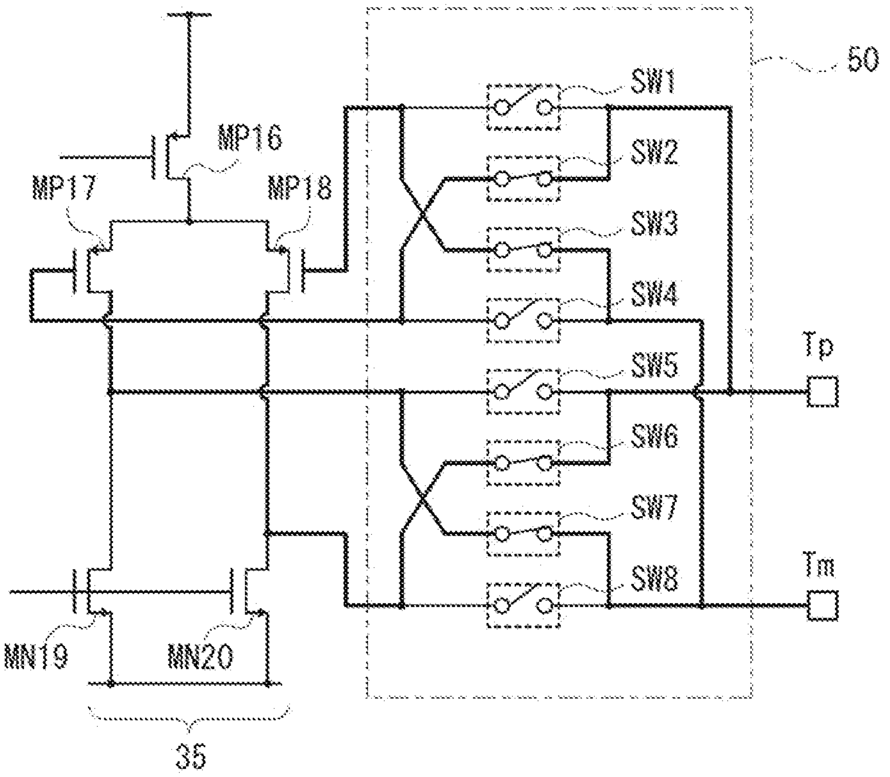

[ FIG. 11 ]
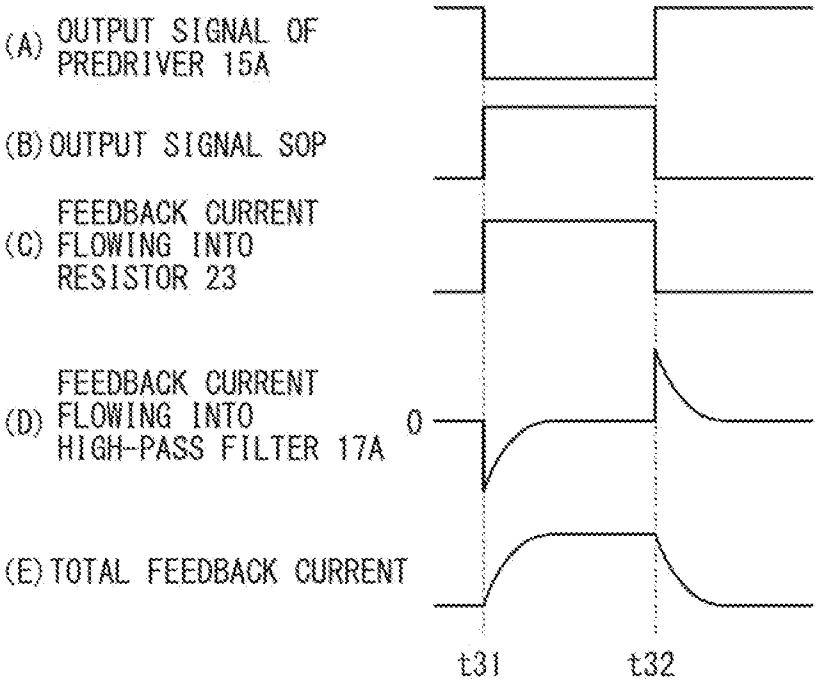

[ FIG. 12 ]
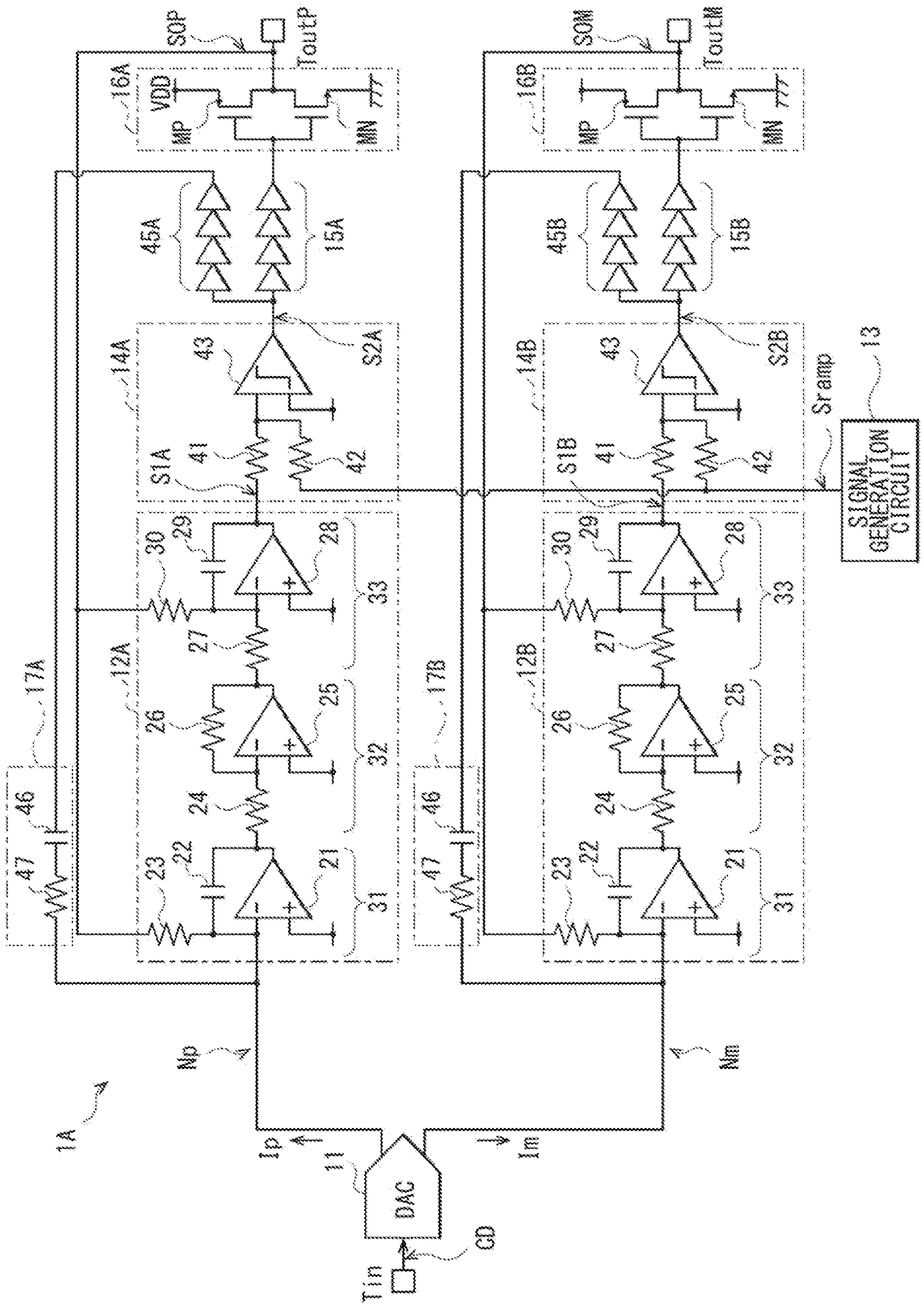

[FIG. 13]
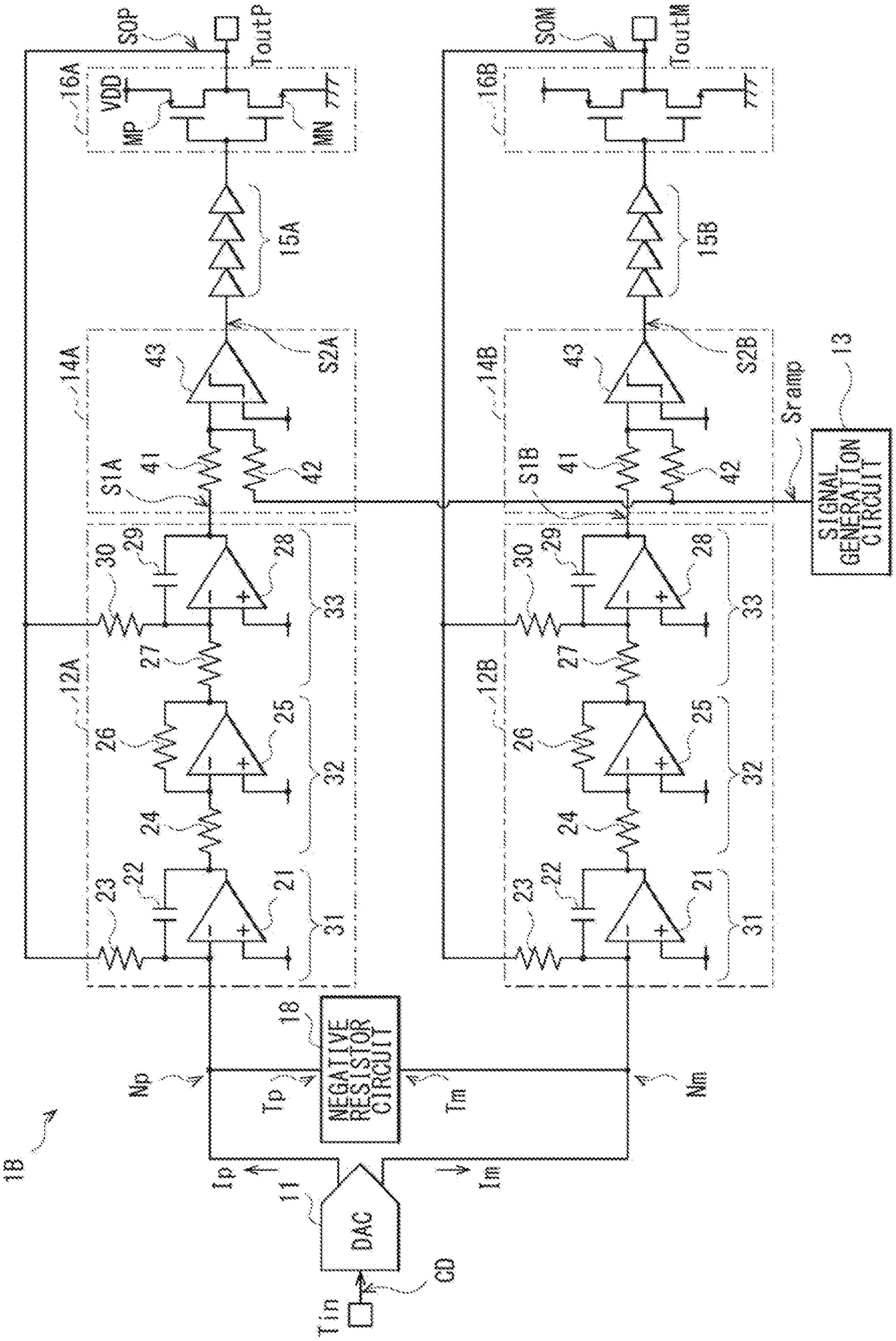

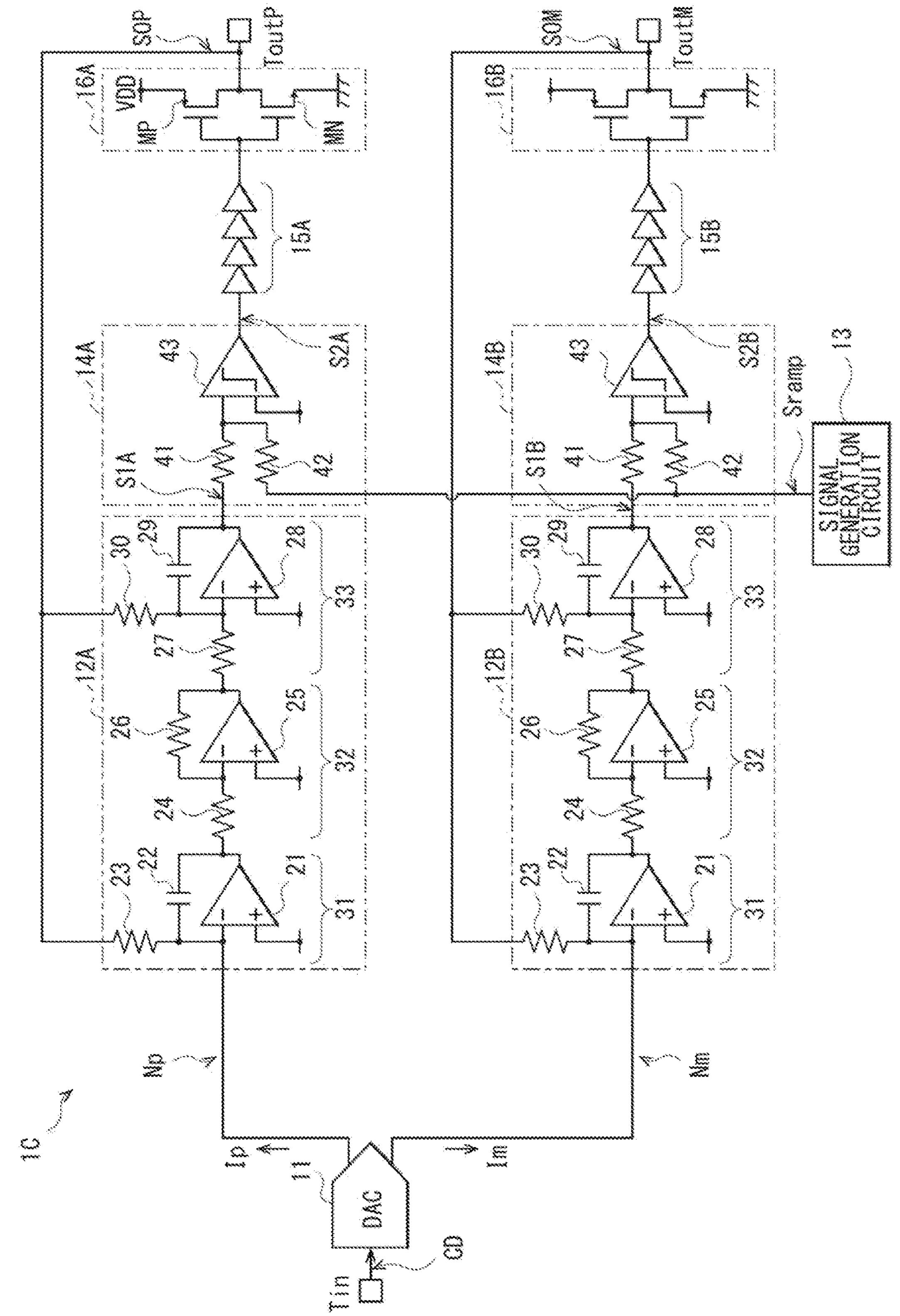
[FIG. 14]
1C
Tin
CD
DAC
11
Ip
Im
Np
Nm
12A
12B
21
22
23
24
25
26
27
28
29
30
31
32
33
S1A
S1B
41
42
43
14A
14B
S2A
S2B
15A
15B
16A
16B
VDD
MP
MN
SOP
SOM
ToutP
ToutM
Sramp
13
SIGNAL GENERATION CIRCUIT

AMPLIFIER CIRCUIT

TECHNICAL FIELD

The present disclosure relates to an amplifier circuit that makes it possible to amplify a signal.

BACKGROUND ART

Some amplifier circuits are used to amplify an audio signal. For example, PTL 1 discloses a class-D amplifier circuit that drives a speaker.

CITATION LIST

Patent Literature

PTL 1: Japanese Unexamined Patent Application Publication No. 2016-127483

SUMMARY OF THE INVENTION

Incidentally, in amplifier circuits, it is desirable to enable a reduction in signal distortion, and a further reduction in the distortion is expected.

It is desirable to provide an amplifier circuit that makes it possible to reduce signal distortion.

An amplifier circuit according to an embodiment of the present disclosure includes an input circuit, a first loop filter, a first modulation circuit, a first output circuit, a second loop filter, a second modulation circuit, and a second output circuit. The input circuit is configured to generate a differential current including a first current and a second current on the basis of an input signal. The first loop filter includes a first former-stage integration circuit, a first inverter circuit, and a first latter-stage integration circuit. The first former-stage integration circuit is configured to perform an integral action on the basis of the first current and a current corresponding to a first output signal. The first inverter circuit is configured to invert an output signal of the first former-stage integration circuit. The first latter-stage integration circuit is configured to generate a first signal by performing an integral action on the basis of an output signal of the first inverter circuit and the first output signal. The first modulation circuit is configured to generate a first modulated signal by modulating the first signal with use of a predetermined signal. The first output circuit is configured to generate the first output signal on the basis of the first modulated signal. The second loop filter includes a second former-stage integration circuit, a second inverter circuit, and a second latter-stage integration circuit. The second former-stage integration circuit is configured to perform an integral action on the basis of the second current and a current corresponding to a second output signal. The second inverter circuit is configured to invert an output signal of the second former-stage integration circuit. The second latter-stage integration circuit is configured to generate a second signal by performing an integral action on the basis of an output signal of the second inverter circuit and the second output signal. The second modulation circuit is configured to generate a second modulated signal by modulating the second signal with use of the predetermined signal. The second output circuit is configured to generate the second output signal on the basis of the second modulated signal.

In the amplifier circuit according to the embodiment of the present disclosure, the differential current including the first current and the second current is generated on the basis of the input signal. In the first loop filter, the first former-stage integration circuit performs the integral action on the basis of the first current and the current corresponding to the first output signal, the first inverter circuit inverts the output signal of the first former-stage integration circuit, and the first latter-stage integration circuit generates the first signal by performing the integral action on the basis of the output signal of the first inverter circuit and the first output signal. The first signal is modulated by the first modulation circuit with use of the predetermined signal to generate the first modulated signal. Thereafter, the first output circuit generates the first output signal on the basis of the first modulated signal. In the second loop filter, the second former-stage integration circuit performs the integral action on the basis of the second current and the current corresponding to the second output signal, the second inverter circuit inverts the output signal of the second former-stage integration circuit, and the second latter-stage integration circuit generates the second signal by performing the integral action on the basis of the output signal of the second inverter circuit and the second output signal. The second signal is modulated by the second modulation circuit with use of the predetermined signal to generate the second modulated signal. Thereafter, the second output circuit generates the second output signal on the basis of the second modulated signal.

BRIEF DESCRIPTION OF DRAWINGS

FIG. 1 is a circuit diagram illustrating a configuration example of an amplifier circuit according to an embodiment of the present disclosure.

FIG. 2 is an explanatory diagram illustrating a coupling example of the amplifier circuit illustrated in FIG. 1.

FIG. 3 is a circuit diagram illustrating a configuration example of a negative resistor circuit illustrated in FIG. 1.

FIG. 4 is a timing waveform diagram illustrating an operation example of the amplifier circuit illustrated in FIG. 1.

FIG. 5 is another timing waveform diagram illustrating an operation example of the amplifier circuit illustrated in FIG. 1.

FIG. 6 is another timing waveform diagram illustrating an operation example of the amplifier circuit illustrated in FIG. 1.

FIG. 7 is a timing waveform diagram illustrating an operation example of the amplifier circuit.

FIG. 8 is another timing waveform diagram illustrating an operation example of the amplifier circuit.

FIG. 9 is an explanatory diagram illustrating an operation state of the negative resistor circuit illustrated in FIG. 1.

FIG. 10 is an explanatory diagram illustrating another operation state of the negative resistor circuit illustrated in FIG. 1.

FIG. 11 is an explanatory diagram illustrating an operation example of the amplifier circuit illustrated in FIG. 1.

FIG. 12 is a circuit diagram illustrating a configuration example of an amplifier circuit according to a modification example.

FIG. 13 is a circuit diagram illustrating a configuration example of an amplifier circuit according to another modification example.

FIG. 14 is a circuit diagram illustrating a configuration example of an amplifier circuit according to another modification example.

MODES FOR CARRYING OUT THE INVENTION

In the following, some embodiments of the present disclosure are described in detail with reference to the drawings.

Embodiment

Configuration Example

FIG. 1 illustrates a configuration example of an amplifier circuit (an amplifier circuit 1) according to an embodiment. FIG. 2 illustrates a coupling example of the amplifier circuit 1. The amplifier circuit 1 is a class-D amplifier circuit that drives a speaker. The amplifier circuit 1 has an input terminal Tin, and output terminals ToutP and ToutM. The amplifier circuit 1 is configured to generate output signals SOP and SOM corresponding to a digital code CD supplied to the input terminal Tin on the basis of the digital code CD, and output the output signal SOP from the output terminal ToutP and output the output signal SOM from the output terminal ToutM. As illustrated in FIG. 2, the amplifier circuit 1 supplies the generated output signals SOP and SOM to a speaker 19. Thus, the amplifier circuit 1 is able to directly drive the speaker 19, for example, without providing an LC filter.

The amplifier circuit 1 includes a digital-analog converter circuit (DAC) 11, loop filters 12A and 12B, a signal generation circuit 13, modulation circuits 14A and 14B, predrivers 15A and 15B, dummy predrivers 45A and 45B, drivers 16A and 16B, high-pass filters 17A and 17B, and a negative resistor circuit 18, as illustrated in FIG. 1. The amplifier circuit 1 includes a circuit group of a system A including the loop filter 12A, the modulation circuit 14A, the predriver 15A, the dummy predriver 45A, and the driver 16A, and a circuit group of a system B including the loop filter 12B, the modulation circuit 14B, the predriver 15B, the dummy predriver 45B, and the driver 16B.

The digital-analog converter circuit 11 is configured to generate currents Ip and Im by performing digital-analog conversion on the basis of the inputted digital code CD. The digital-analog converter circuit 11 has an input terminal coupled to the input terminal Tin, and two output terminals coupled to nodes Np and Nm. The digital-analog converter circuit 11 causes the current Ip to flow into the node Np, and causes the current Im to flow into the node Nm. The current Ip and the current Im configure a differential current. In other words, in a case where the current Ip flows from the digital-analog converter circuit 11 to the node Np, the current Im flows from the node Nm to the digital-analog converter circuit 11. In addition, in a case where the current Ip flows from the node Np to the digital-analog converter circuit 11, the current Im flows from the digital-analog converter circuit 11 to the node Nm.

The loop filter 12A is configured to generate a signal S1A on the basis of the current Ip and the output signal SOP. The loop filter 12A includes an operational amplifier circuit 21, a capacitor 22, a resistor 23, a resistor 24, an operational amplifier circuit 25, a resistor 26, a resistor 27, an operational amplifier circuit 28, a capacitor 29, and a resistor 30.

The operational amplifier circuit 21 has a positive input terminal to be supplied with a reference voltage, a negative input terminal coupled to the node Np, and an output terminal coupled to the capacitor 22 and the resistor 24. This reference voltage is a voltage between a power supply voltage VDD and a ground voltage. The capacitor 22 has one end coupled to the node Np, and another end coupled to the output terminal of the operational amplifier circuit 21 and the resistor 24. The resistor 23 has one end coupled to the output terminal ToutP of the amplifier circuit 1, and another end coupled to the node Np. The resistor 23 has the one end to be supplied with the output signal SOP. The operational amplifier circuit 21, the capacitor 22, and the resistor 23 configure an integration circuit 31.

The resistor 24 has one end coupled to the output terminal of the operational amplifier circuit 21 and the capacitor 22, and another end coupled to a negative input terminal of the operational amplifier circuit 25 and the resistor 26. The operational amplifier circuit 25 has a positive input terminal to be supplied with the reference voltage, the negative input terminal coupled to the resistors 24 and 26, and an output terminal coupled to the resistors 26 and 27. The resistor 26 has one end coupled to the resistor 24 and the negative input terminal of the operational amplifier circuit 25, and another end coupled to the output terminal of the operational amplifier circuit 25 and the resistor 27. The resistor 24, the operational amplifier circuit 25, and the resistor 26 configure an inverter circuit 32.

The resistor 27 has one end coupled to the output terminal of the operational amplifier circuit 25 and the resistor 26, and another end coupled to a negative input terminal of the operational amplifier circuit 28, the capacitor 29, and the resistor 30. The operational amplifier circuit 28 has a positive input terminal to be supplied with the reference voltage, the negative input terminal coupled to the resistors 27 and 30 and the capacitor 29, and an output terminal coupled to the capacitor 29 and the modulation circuit 14A. The capacitor 29 has one end coupled to the resistors 27 and 30 and the negative input terminal of the operational amplifier circuit 28, and another end coupled to the output terminal of the operational amplifier circuit 28 and the modulation circuit 14A. The resistor 30 has one end coupled to the output terminal ToutP of the amplifier circuit 1, and another end coupled to the resistor 27, the negative input terminal of the operational amplifier circuit 28, and the capacitor 29. The resistor 30 has the one end to be supplied with the output signal SOP. The resistors 27 and 30, the operational amplifier circuit 28, and the capacitor 29 configure an integration circuit 33. The integration circuit 33 outputs the signal S1A.

The loop filter 12B is configured to generate a signal S1B on the basis of the current Im and the output signal SOM. As with the loop filter 12A, the loop filter 12B includes the operational amplifier circuit 21, the capacitor 22, the resistor 23, the resistor 24, the operational amplifier circuit 25, the resistor 26, the resistor 27, the operational amplifier circuit 28, the capacitor 29, and the resistor 30. In the loop filter 12B, the operational amplifier circuit 21 has the negative input terminal coupled to the node Nm. The capacitor 22 has the one end coupled to the node Nm. The resistor 23 has the one end coupled to the output terminal ToutM of the amplifier circuit 1, and the other end coupled to the node Nm. The resistor 23 has the one end to be supplied with the output signal SOM. The resistor 30 has the one end coupled to the output terminal ToutM of the amplifier circuit 1. The resistor 30 has the one end to be supplied with the output signal SOM. The operational amplifier circuit 28 has the output terminal coupled to the capacitor 29 and the modulation circuit 14B. The capacitor 29 has the other end coupled to the output terminal of the operational amplifier circuit 28 and the modulation circuit 14B. The integration circuit 33 outputs the signal S1B.

The signal generation circuit 13 is configured to generate a signal Sramp having a waveform with a triangular wave shape.

The modulation circuit 14A is configured to generate a signal S2A by modulating the signal S1A with use of the signal Sramp. The modulation circuit 14A includes resistors 41 and 42, and a comparator circuit 43. The resistor 41 has one end coupled to the loop filter 12A, and another end coupled to the resistor 42 and a first input terminal of the comparator circuit 43. The resistor 42 has one end coupled to the signal generation circuit 13, and another end coupled to the resistor 41 and the first input terminal of the comparator circuit 43. The resistor 42 has the one end to be supplied with the signal Sramp. The comparator circuit 43 has the first input terminal coupled to the resistors 41 and 42, a second input terminal to be supplied with the reference voltage, and an output terminal coupled to the predriver 15A and the dummy predriver 45A. The comparator circuit 43 outputs the signal S2A.

The modulation circuit 14B is configured to generate a signal S2B by modulating the signal S1B with use of the signal Sramp. As with the modulation circuit 14A, the modulation circuit 14B includes the resistors 41 and 42, and the comparator circuit 43. The resistor 41 has the one end coupled to the loop filter 12B. The comparator circuit 43 has the output terminal coupled to the predriver 15B and the dummy predriver 45B. The comparator circuit 43 outputs the signal S2B.

The predriver 15A is configured to drive the driver 16A on the basis of the signal S2A. The predriver 15A has an input terminal coupled to an input terminal of the dummy predriver 45A and the modulation circuit 14A, and an output terminal coupled to the driver 16A. The dummy predriver 45A has the input terminal coupled to the input terminal of the predriver 15A and the modulation circuit 14A, and an output terminal coupled to the high-pass filter 17A. It is possible for the dummy predriver 45A to have, for example, the same circuit configuration as the circuit configuration of the predriver 15A. An output signal of the dummy predriver 45A is an inverted signal of the output signal SOP generated by the driver 16A.

The predriver 15B is configured to drive the driver 16B on the basis of the signal S2B. The predriver 15B has an input terminal coupled to an input terminal of the dummy predriver 45B and the modulation circuit 14B, and an output terminal coupled to the driver 16B. The dummy predriver 45B has the input terminal coupled to the input terminal of the predriver 15B and the modulation circuit 14B, and an output terminal coupled to the high-pass filter 17B. An output signal of the dummy predriver 45B is an inverted signal of the output signal SOM generated by the driver 16B.

The driver 16A is configured to generate the output signal SOP. The driver 16A includes transistors MP and MN. The transistor MP is a P-type MOS (Metal Oxide Semiconductor) transistor, and has a gate coupled to a gate of the transistor MN and the predriver 15A, a source to be supplied with the power supply voltage VDD, and a drain coupled to a drain of the transistor MN, the resistors 23 and 30 of the loop filter 12A, and the output terminal ToutP. The transistor MN is an N-type MOS transistor, and has the gate coupled to the gate of the transistor MP and the predriver 15A, the drain coupled to the drain of the transistor MP, the resistors 23 and 30 of the loop filter 12A, and the output terminal ToutP, and a source grounded.

The driver 16B is configured to generate the output signal SOM. As with the driver 16A, the driver 16B includes the transistors MP and MN. The transistor MP has the gate coupled to the gate of the transistor MN and the predriver 15B, and the drain coupled to the drain of the transistor MN, the resistors 23 and 30 of the loop filter 12B, and the output terminal ToutM. The transistor MN has the gate coupled to the gate of the transistor MP and the predriver 15B, and the drain coupled to the drain of the transistor MP, the resistors 23 and 30 of the loop filter 12B, and the output terminal ToutM.

The high-pass filter 17A is configured to add a high-frequency component of the output signal of the dummy predriver 45A to an input signal of the loop filter 12A. The high-pass filter 17A includes a capacitor 46 and a resistor 47. The capacitor 46 has one end coupled to the dummy predriver 45A, and another end coupled to the resistor 47. The resistor 47 has one end coupled to the capacitor 46, and another end coupled to the node Np. It is possible for the resistor 47 to have, for example, a resistance value substantially equal to a resistance value of the resistor 23 of the loop filter 12A.

The high-pass filter 17B is configured to add a high-frequency component of the output signal of the dummy predriver 45B to an input signal of the loop filter 12B. As with the high-pass filter 17A, the high-pass filter 17B includes the capacitor 46 and the resistor 47. The capacitor 46 has the one end coupled to the dummy predriver 45B. The resistor 47 has the other end coupled to the node Nm. It is possible for the resistor 47 to have, for example, a resistance value substantially equal to a resistance value of the resistor 23 of the loop filter 12B.

The negative resistor circuit 18 is configured to operate as a circuit having a negative resistance value. The negative resistor circuit 18 has a terminal Tp and a terminal Tm. The terminal Tp is coupled to the node Np, and the terminal Tm is coupled to the node Nm.

FIG. 3 illustrates a configuration example of the negative resistor circuit 18. The negative resistor circuit 18 includes transistors MP11, MP13, MN14, MN15, MP16, MP17, MP18, MN19, and MN20, a resistor R12, and a chopper circuit 50. The transistors MP11, MP13, and MP16 to MP18 are P-type MOS transistors, and the transistors MN14, MN15, MN19, and MN20 are N-type MOS transistors.

The transistor MP11 has a gate coupled to gates of the transistors MP13 and MP16 and drains of the transistors MP11 and MN14, a source to be supplied with a power supply voltage, and a drain coupled to gates of the transistors MP11, MP13, and MP16, and a drain of the transistor MN14. The resistor R12 has one end to be supplied with the power supply voltage, and another end coupled to a source of the transistor MP13. The kind of the resistor R12 is the same as the kind of the resistor 23 in each of the loop filters 12A and 12B. In this example, the resistor R12 is a polysilicon resistor. The transistor MP13 has the gate coupled to the gates of the transistors MP11 and MP16 and the drains of the transistors MP11 and MN14, a source coupled to the resistor R12, a drain coupled to a drain of the transistor MN15 and gates of the transistors MN14, MN15, MN19, and MN20, and a back gate coupled to a source of the transistor MP13. A gate length of the transistor MP13 is equal to a gate length of the transistor MP11, and a gate width of the transistor MP13 is "K" times larger than a gate width of the transistor MP11. The transistor MN14 has the gate coupled to the gates of the transistors MN15, MN19, and MN20 and the drains of the transistors MP13 and MN15, the drain coupled to the gates of the transistors MP11, MP13, and MP16 and the drain of the transistor MP11, and a source grounded. The transistor MN15 has the gate coupled to the gates of the transistors MN14, MN19, and MN20 and the drains of the transistors MP13 and MN15, the drain coupled to the gates of the transistors MN14, MN15, MN19, and MN20 and the drain of the transistor MP13, and a source grounded. The transistors MP11, MP13, MN14, and MN15, and the resistor R12 configure a bias circuit 34.

The transistor MP16 has the gate coupled to the gates of the transistors MP11 and MP13 and the drains of the transistors MP11 and MN14, a source to be supplied with the power supply voltage, and a drain coupled to sources of the transistors MP17 and MP18. The transistor MP17 has a gate coupled to the chopper circuit 50, the source coupled to the source of the transistor MP18 and the drain of the transistor MP16, and a drain coupled to a drain of the transistor MN19 and the chopper circuit 50. The transistor MP18 has a gate coupled to the chopper circuit 50, the source coupled to the source of the transistor MP17 and the drain of the transistor MP16, and a drain coupled to a drain of the transistor MN20 and the chopper circuit 50. The transistor MN19 has the gate coupled to the gates of the transistors MN14, MN15, and MN20 and the drains of the transistors MP13 and MN15, the drain coupled to the drain of the transistor MP17 and the chopper circuit 50, and a source grounded. The transistor MN20 has the gate coupled to the gates of the transistors MN14, MN15, and MN19 and the drains of the transistors MP13 and MN15, the drain coupled to the drain of the transistor MP18 and the chopper circuit 50, and a source grounded. The transistors MP16 to MP18, MN19, and MN20 configure a differential circuit 35. Specifically, the transistor MP16 configures a current source, the transistors MP17 and MP18 configure a differential pair, and the transistors MN19 and MN20 configure an active load of the differential pair.

The chopper circuit 50 includes a chopper control circuit 51, an inverter 52, and switches SW1 to SW8.

The chopper control circuit 51 is configured to generate a control signal CTL that turns on or off the switches SW1 to SW8. The chopper control circuit 51 causes the control signal CTL to transition between a low level and a high level at each lapse of time equal to one period of the signal Sramp generated by the signal generation circuit 13.

The inverter 52 is configured to generate an inverted signal of the control signal CTL on the basis of the control signal CTL.

The switch SW1 has one end coupled to the gate of the transistor MP18, and another end coupled to the terminal Tp, and is configured to turn on or off on the basis of the control signal CTL. The switch SW2 has one end coupled to the gate of the transistor MP17 and another end coupled to the terminal Tp, and is configured to turn on or off on the basis of the inverted signal of the control signal CTL. The switch SW3 has one end coupled to the gate of the transistor MP18 and another end coupled to the terminal Tm, and is configured to turn on or off on the basis of the inverted signal of the control signal CTL. The switch SW4 has one end coupled to the gate of the transistor MP17 and another end coupled to the terminal Tm, and is configured to turn on or off on the basis of the control signal CTL.

The switch SW5 has one end coupled to the drain of the transistor MP17 and another end coupled to the terminal Tp, and is configured to turn on or off on the basis of the control signal CTL. The switch SW6 has one end coupled to the drain of the transistor MP18 and another end coupled to the terminal Tp, and is configured to turn on or off on the basis of the inverted signal of the control signal CTL. The switch SW7 has one end coupled to the drain of the transistor MP17 and another end coupled to the terminal Tm, and is configured to turn on or off on the basis of the inverted signal of the control signal CTL. The switch SW8 has one end coupled to the drain of the transistor MP18 and another end coupled to the terminal Tm, and is configured to turn on or off on the basis of the control signal CTL.

Here, the digital-analog converter circuit 11 corresponds to a specific example of an "input circuit" in the present disclosure. The digital code CD corresponds to a specific example of an "input signal" in the present disclosure. The current Ip corresponds to a specific example of a "first current" in the present disclosure. The current Im corresponds to a specific example of a "second current" in the present disclosure.

The loop filter 12A corresponds to a specific example of a "first loop filter" in the present disclosure. The integration circuit 31 of the loop filter 12A corresponds to a specific example of a "first former-stage integration circuit" in the present disclosure. The operational amplifier circuit 21 of the loop filter 12A corresponds to a specific example of a "first operational amplifier circuit" in the present disclosure. The capacitor 22 of the loop filter 12A corresponds to a specific example of a "first capacitor" in the present disclosure. The resistor 23 of the loop filter 12A corresponds to a specific example of a "first resistor" in the present disclosure. The inverter circuit 32 of the loop filter 12A corresponds to a specific example of a "first inverter circuit" in the present disclosure. The integration circuit 33 of the loop filter 12A corresponds to a specific example of a "first latter-stage integration circuit" in the present disclosure. The signal S1A corresponds to a specific example of a "first signal" in the present disclosure. The loop filter 12B corresponds to a specific example of a "second loop filter" in the present disclosure. The integration circuit 31 of the loop filter 12B corresponds to a specific example of a "second former-stage integration circuit" in the present disclosure. The operational amplifier circuit 21 of the loop filter 12B corresponds to a specific example of a "second operational amplifier circuit" in the present disclosure. The capacitor 22 of the loop filter 12B corresponds to a specific example of a "second capacitor" in the present disclosure. The resistor 23 of the loop filter 12B corresponds to a specific example of a "second resistor" in the present disclosure. The inverter circuit 32 of the loop filter 12B corresponds to a specific example of a "second inverter circuit" in the present disclosure. The integration circuit 33 of the loop filter 12B corresponds to a specific example of a "second latter-stage integration circuit" in the present disclosure. The signal S1B corresponds to a specific example of a "second signal" in the present disclosure.

The modulation circuit 14A corresponds to a specific example of a "first modulation circuit" in the present disclosure. The signal S2A corresponds to a specific example of a "first modulated signal" in the present disclosure. The modulation circuit 14B corresponds to a specific example of a "second modulation circuit" in the present disclosure. The signal S2B corresponds to a specific example of a "second modulated signal" in the present disclosure. The signal Sramp corresponds to a specific example of a "predetermined signal" in the present disclosure.

The predriver 15A and the driver 16A correspond to specific examples of a "first output circuit" in the present disclosure. The driver 16A corresponds to a specific example of a "first driver" in the present disclosure. The output signal SOP corresponds to a specific example of a "first output signal" in the present disclosure. The predriver 15B and the driver 16B correspond to specific examples of a "second output circuit" in the present disclosure. The driver 16B corresponds to a specific example of a "second driver" in the present disclosure. The output signal SON corresponds to a specific example of a "second output signal" in the present disclosure.

The high-pass filter 17A corresponds to a specific example of a "first high-pass filter" in the present disclosure. The dummy predriver 45A corresponds to a specific example of a "first circuit" in the present disclosure. The output signal of the dummy predriver 45A corresponds to a specific example of a "first feedback signal" in the present disclosure. The high-pass filter 17B corresponds to a specific example of a "second high-pass filter" in the present disclosure. The dummy predriver 45B corresponds to a specific example of a "second circuit" in the present disclosure. The output signal of the dummy predriver 45B corresponds to a specific example of a "second feedback signal" in the present disclosure.

The negative resistor circuit 18 corresponds to a specific example of a "negative resistor circuit" in the present disclosure. The node Np corresponds to a specific example of a "first node" in the present disclosure. The node Nm corresponds to a specific example of a "second node" in the present disclosure. The terminal Tp corresponds to a specific example of a "first terminal" in the present disclosure. The terminal Tm corresponds to a specific example of a "second terminal" in the present disclosure. The transistor MP17 corresponds to a specific example of a "first transistor" in the present disclosure. The transistor MP18 corresponds to a specific example of a "second transistor" in the present disclosure.

Operation and Workings

Next, description is given of an operation and workings of the amplifier circuit 1 according to the present embodiment.

Overview of Entire Operation

First, description is given of an overview of an entire operation of the amplifier circuit 1 with reference to FIG. 1. The digital-analog converter circuit 11 performs digital/analog conversion on the basis of the inputted digital code CD to generate the currents Ip and Im.

The loop filter 12A generates the signal S1A on the basis of the current Ip and the output signal SOP. The modulation circuit 14A modulates the signal S1A with use of the signal Sramp to generate the signal S2A. The predriver 15A drives the driver 16A on the basis of the signal S2A. The driver 16A generates the output signal SOP. The high-pass filter 17A adds a high-frequency component of the output signal of the dummy predriver 45A to the input signal of the loop filter 12A.

The loop filter 12B generates the signal S1B on the basis of the current Im and the output signal SOM. The modulation circuit 14B modulates the signal S1B with use of the signal Sramp to generate the signal S2B. The predriver 15B drives the driver 16B on the basis of the signal S2B. The driver 16B generates the output signal SOM. The high-pass filter 17B adds a high-frequency component of the output signal of the dummy predriver 45B to the input signal of the loop filter 12B.

The signal generation circuit 13 generates the signal Sramp having a waveform with a triangular wave shape. The negative resistor circuit 18 operates as a circuit having a negative resistance value.

Detailed Operation

FIG. 4 illustrates an operation example of the amplifier circuit 1, where (A) indicates a value of the digital code CD, (B) indicates a waveform of a differential current (Ip-Im) of the currents Ip and Im outputted from the digital-analog converter circuit 11, and (C) indicates a waveform of a differential output signal (SOP-SOM) of the output signals SOP and SOM of the amplifier circuit 1.

In this example, the digital code CD having a value that varies like a sine wave is inputted ((A) of FIG. 4). The digital-analog converter circuit 11 performs digital/analog conversion on the basis of the digital code CD to generate the currents Ip and Im. The differential current (Ip-Im) indicated by the currents Ip and Im has a waveform corresponding to the digital code CD ((B) of FIG. 4). In other words, in a case where the value of the digital code CD is higher than a median M, the differential current becomes positive, and in a case where the value of the digital code CD is lower than the median M, the differential current becomes negative.

The circuit group of the system A including the loop filter 12A, the modulation circuit 14A, the predriver 15A, the dummy predriver 45A, and the driver 16A generates the output signal SOP on the basis of the current Ip, and the circuit group of the system B including the loop filter 12B, the modulation circuit 14B, the predriver 15B, the dummy predriver 45B, and the driver 16B generates the output signal SOM on the basis of the current Im. The differential output signal (SOP-SOM) indicated by the output signals SOP and SOM transitions between "VDD" and "0 V" in a case where the value of the digital code CD is higher than the median M, and transitions between "−VDD" and "0 V" in a case where the value of the digital code CD is lower than the median M ((C) of FIG. 4).

FIG. 5 illustrates an operation example of the amplifier circuit 1 around a timing tA in FIG. 4, where (A) indicates a waveform of the signal Sramp, (B) indicates a waveform of the signal S1A, (C) indicates a waveform of the signal S1B, (D) indicates a waveform of the output signal SOP, (E) indicates a waveform of the output signal SOM, and (F) indicates a waveform of the differential output signal (SOP-SOM) of the output signals SOP and SOM. (A) to (C) of FIG. 5 illustrate the signal Sramp, the signal S1A, and the signal S1B on the same voltage axis.

The signal generation circuit 13 generates the signal Sramp having a waveform with a triangular wave shape ((A) of FIG. 5). The loop filter 12A generates the signal S1A on the basis of the current Ip and the output signal SOP, and the loop filter 12B generates the signal S1B on the basis of the current Im and the output signal SOM ((B) and (C) of FIG. 5). Voltages of the signals S1A and S1B are voltages corresponding to the digital code CD, and are voltages corresponding to the differential current (Ip-Im) indicated by the currents Ip and Im. As illustrated in FIG. 4, at the timing tA, the value of the digital code CD is higher than the median M; therefore, the voltage of the signal S1A is lower than the voltage of the signal S1B. For example, in a case where the value of the digital code CD further increases, the voltage of the signal S1A decreases and the voltage of the signal S1B increases, as indicated by arrows in (B) and (C) of FIG. 5.

For example, the voltage of the signal Sramp exceeds the voltage of the signal S1A at a timing t11, and falls below the voltage of the signal S1A at a timing t14 ((A) and (B) of FIG. 5). This causes the output signal SOP to change from a low level (0 V) to a high level (VDD) at the timing t11 and change from the high level (VDD) to the low level (0 V) at the timing t14 ((D) of FIG. 5). For example, in a case where the value of the digital code CD further increases, the voltage of the signal S1A decreases; therefore, the timing t11 moves to the left, and the timing t14 moves to the right, as indicated by arrows in (D) of FIG. 5.

In addition, for example, the voltage of the signal Sramp exceeds the voltage of the signal S1B at a timing t12, and falls below the voltage of the signal S1B at a timing t13 ((A) and (C) of FIG. 5). This causes the output signal SOM to change from the low level (0 V) to the high level (VDD) at the timing t12 and change from the high level (VDD) to the low level (0 V) at the timing t13 ((E) of FIG. 5). For example, in a case where the value of the digital code CD further increases, the voltage of the signal S1B increases: therefore, the timing t12 moves to the right, and the timing t13 moves to the left, as indicated by arrows in (E) of FIG. 5.

As a result, the differential output signal (SOP-SOM) of the output signals SOP and SOM transitions between "VDD" and "0 V" ((F) of FIG. 5). For example, in a case where the value of the digital code CD further increases, a time length of a period in which the differential output signal is at "VDD" (e.g., a period from the timing t11 to the timing t12) increases.

FIG. 6 illustrates an operation example of the amplifier circuit 1 around a timing tB in FIG. 4. As illustrated in FIG. 4, at the timing tB, the value of the digital code CD is lower than the median M: therefore, the voltage of the signal S1A is higher than the voltage of the signal S1B. For example, in a case where the value of the digital code CD further decreases, the voltage of the signal S1A increases, and the voltage of the signal S1B decreases, as indicated by arrows in (B) and (C) of FIG. 5.

For example, the voltage of the signal Sramp exceeds the voltage of the signal S1A at a timing t22, and falls below the voltage of the signal S1A at a timing t23 ((A) and (B) of FIG. 6). This causes the output signal SOP to change from the low level (0 V) to the high level (VDD) at the timing t22 and change from the high level (VDD) to the low level (0V) at a timing t23 ((D) of FIG. 6). For example, in a case where the value of the digital code CD further decreases, the voltage of the signal S1A increases; therefore, the timing t22 moves to the right, and the timing t22 moves to the left, as indicated by arrows in (D) of FIG. 6.

In addition, for example, the voltage of the signal Sramp exceeds the voltage of the signal S1B at a timing t21, and falls below the voltage of the signal S1B at a timing t24 ((A) and (C) of FIG. 6). This causes the output signal SOM to change from the low level (0 V) to the high level (VDD) at the timing t21 and change from the high level (VDD) to the low level (0V) at the timing t24 ((E) of FIG. 6). For example, in a case where the value of the digital code CD further decreases, the voltage of the signal S1B decreases: therefore, the timing t21 moves to the left, and the timing t24 moves to the right, as indicated by arrows in (E) of FIG. 6.

As a result, the differential output signal (SOP-SOM) of the output signals SOP and SOM transitions between "−VDD" and "0 V" ((F) of FIG. 5). For example, in a case where the value of the digital code CD further decreases, a time length of a period in which the differential output signal is at "−VDD" (e.g., a period from the timing t21 to the timing t22) increases.

Thus, as illustrated in FIG. 4, in a case where the value of the digital code CD is higher than the median M, the differential output signal (SOP-SOM) transitions between "VDD" and "0 V". Further, the higher the value of the digital code CD is, the longer the time length of the period in which the differential output signal is at "VDD" becomes. In addition, in a case where the value of the digital code CD is lower than the median M, the differential output signal (SOP-SOM) transitions between "−VDD" and "0 V". Further, the lower the value of the digital code CD is, the longer the time length of the period in which the differential output signal is at "−VDD" becomes.

The speaker 19 subsequent to the amplifier circuit 1 vibrates, for example, a diaphragm such as a cone on the basis of such a differential output signal of the output signals SOP and SOM. This causes the speaker 19 to output sound having a waveform (a waveform W1 in (C) of FIG. 4) of a signal of a low-frequency component included in the differential output signal.

As illustrated in FIG. 1, the amplifier circuit 1 includes the circuit group of the system A including the loop filter 12A, the modulation circuit 14A, the predriver 15A, the dummy predriver 45A, and the driver 16A, and the circuit group of the system B including the loop filter 12B, the modulation circuit 14B, the predriver 15B, the dummy predriver 45B, and the driver 16B, which makes it possible to reduce signal distortion.

In other words, for example, in a case where, as with a technology described in PTL 1, a loop filter having a differential configuration is configured with use of a differential operational amplifier, there is a possibility that so-called crossover distortion occurs. For example, as illustrated in FIG. 4, in a case where the digital code CD is around the median M, a pulse width of the differential output signal (SOP-SOM) is narrowed. Specifically, as illustrated in FIGS. 7 and 8, in a case where the digital code CD is around the median M, a pulse width of the output signal SOP and a pulse width of the output signal SOM are substantially equal to each other, which causes the pulse width of the differential output signal (SOP-SOM) to be narrowed. There is a possibility that the loop filter having the differential configuration is not able to perform a desired operation with respect to such a narrow pulse width, and in such a case, crossover distortion occurs.

In contrast, the amplifier circuit 1 according to the present embodiment includes two loop filters 12A and 12B. The loop filter 12A generates the signal S1A on the basis of the current Ip and the output signal SOP, and the loop filter 12B generates the signal S1B on the basis of the current Im and the output signal SOM. Accordingly, in a case where the digital code CD is around the median M, the loop filter 12A operates on the basis of the current Ip and the output signal SOP having a wide pulse width ((A) of FIG. 7 and (A) of FIG. 8), and the loop filter 12B operates on the basis of the current Im and the output signal SOM having a wide pulse width ((B) of FIG. 7 and (B) of FIG. 8). Accordingly, in the amplifier circuit 1, it is possible to reduce a possibility that crossover distortion occurs.

In addition, in the amplifier circuit 1, each of the loop filters 12A and 12B is provided with two integration circuits 31 and 33. This makes it possible to increase an open loop gain in the amplifier circuit 1. For example, in the circuit group of the system A, a gain of the loop filter 12A is high, which makes it possible to suppress signal distortion and noise caused by the modulation circuit 14A, the predriver 15A, and the driver 16A that are circuits subsequent to the loop filter 12A in a loop of the system A. Likewise, for example, in the circuit group of the system B, a gain of the loop filter 12B is high, which makes it possible to suppress signal distortion and noise caused by the modulation circuit 14B, the predriver 15B, and the driver 16B that are circuits subsequent to the loop filter 12B in a loop of the system B. As a result, in the amplifier circuit 1, it is possible to reduce signal distortion and noise.

In addition, in the amplifier circuit 1, the output signal SOP is fed back to the integration circuit 31 and the integration circuit 33 of the loop filter 12A, and the output signal SOM is fed back to the integration circuit 31 and the integration circuit 33 of the loop filter 12B. In other words, each of the loop filters 12A and 12B is provided with two integration circuits 31 and 33; therefore, the open loop gain is increased, which easily causes oscillation. In the amplifier circuit 1, feedback to the integration circuit 31 in a former stage is performed and feedback to the integration circuit 33 in a latter stage is also performed. This makes it possible to secure a phase margin and hinder oscillation from occurring. As a result, as described above, in the amplifier circuit 1, it is possible to effectively reduce signal distortion and noise by a high open loop gain.

(About Operation of Negative Resistor Circuit 18)

For example, increasing the gain of the integration circuit 31 in a first stage in the loop filter 12A makes it possible to suppress noise caused by the inverter circuit 32, the integration circuit 33, the modulation circuit 14A, the predriver 15A, and the driver 16A that are circuits subsequent to the integration circuit 31 in the loop of the system A. Likewise, increasing the gain of the integration circuit 31 in a first stage in the loop filter 12B makes is possible to suppress noise caused by the inverter circuit 32, the integration circuit 33, the modulation circuit 14B, the predriver 15B, and the driver 16B that are circuits subsequent to the integration circuit 31 in the loop of the system B. In addition, in the amplifier circuit 1, for a purpose of reducing noise of the integration circuits 31 in the first stages in the loop filters 12A and 12B, the negative resistor circuit 18 is provided. An operation of the negative resistor circuit 18 is described in detail below.

For example, it is possible to convert, for example, noise that is caused in the loop filter 12A, the modulation circuit 14A, the predriver 15A, and the driver 16A into noise to be inputted to the loop filter 12A. Likewise, it is possible to convert, for example, noise that is caused in the loop filter 12B, the modulation circuit 14B, the predriver 15B, and the driver 16B into noise to be inputted to the loop filter 12B. It is possible to cancel out this noise by causing a current having a magnitude of "VN/RF" to flow into the resistor 23, where "VN" is input referred noise and "RF" is a resistance value of the resistor 23. In the amplifier circuit 1, these noises are cancelled out by providing the negative resistor circuit 18.

FIG. 9 illustrates an operation state of the negative resistor circuit 18, and FIG. 10 illustrates another operation state of the negative resistor circuit 18. It is to be noted that in FIGS. 9 and 10, a portion of the negative resistor circuit 18 (FIG. 3) is not illustrated. The operation state of the negative resistor circuit 18 switches between the operation state illustrated in FIG. 9 and the operation state illustrated in FIG. 10 at each lapse of time equal to one period of the signal Sramp.

In the operation state illustrated in FIG. 9, the switches SW1, SW4, SW5, and SW8 are turned on, and the switches SW2, SW3, SW6, and SW7 are turned off. In this case, the terminal Tp is coupled to the drain of the transistor MP17 and the gate of the transistor MP18, and the terminal Tm is coupled to the gate of the transistor MP17 and the drain of the transistor MP18. Such coupling causes positive feedback to be applied in the negative resistor circuit 18. As a result, it is possible for the negative resistor circuit 18 to make a resistance value between the terminal Tp and the terminal Tm negative. It is possible to represent this resistance value R, for example, by the following expression.

$$R = -\frac{1}{gm} \propto -\frac{1}{\frac{2}{Rs}\left(1 - \frac{1}{\sqrt{K}}\right)} \qquad \text{[Math. 1]}$$

Here, gm is a transconductance of the transistors MP17 and MP18, Rs is a resistance value of the resistor R12, and K is a ratio of gate widths of the transistor MP13 and the transistor MP11 (FIG. 3). Noises caused by the integration circuits 31 in the first stages in the loop filters 12A and 12B are applied to such a negative resistor to generate a current. This current then flows into the resistor 23, thereby cancelling out noises in the loop filters 12A and 12B. In this example, the kind of the resistor R12 is the same as the kind of the resistor 23 in each of the loop filters 12A and 12B, and is a polysilicon resistor. In the incorrect resistor circuit 18, the kinds of the resistor R12 and the resistor 23 are the same as each other, which makes it possible to cancel process variations and temperature fluctuation of the polysilicon resistor, and makes it possible to effectively cancel out noises of the integration circuits 31 in the first stages of the loop filters 12A and 12B.

In the operation state illustrated in FIG. 10, the switches SW2, SW3, SW6, and SW7 are turned on, and the switches SW1, SW4, SW5, and SW8 are turned off. In this case, the terminal Tp is coupled to the gate of the transistor MP17 and the drain of the transistor MP18, and the terminal Tm is coupled to the drain of the transistor MP17 and the gate of the transistor MP18. Such coupling causes positive feedback to be applied in the negative resistor circuit 18. As a result, it is possible for the negative resistor circuit 18 to make the resistance value between the terminal Tp and the terminal Tm negative. Noises caused by the integration circuits 31 in the first stages in the loop filters 12A and 12B are then applied to the negative resistor to generate a current. This current flows into the resistor 23, thereby cancelling out noises in the loop filters 12A and 12B.

The operation state of the negative resistor circuit 18 switches between the operation state illustrated in FIG. 9 and the operation state illustrated in FIG. 10 at each lapse of time equal to one period of the signal Sramp. In the operation state illustrated in FIG. 9, for example, the terminal Tp is coupled to the gate of the transistor MP18, and the terminal Tm is coupled to the gate of the transistor MP17. In the operation state illustrated in FIG. 10, for example, the terminal Tp is coupled to the gate of the transistor MP17, and the terminal Tm is coupled to the gate of the transistor MP18. In other words, the transistors MP17 and MP18 are changed between the operation state in FIG. 9 and the operation state in FIG. 10. This makes it possible to convert low-frequency noise caused by flicker noise generated in the negative resistor circuit 18 into high-frequency noise. As a result, in the amplifier circuit 1, it is possible to reduce the low-frequency noise.

Thus, in the amplifier circuit 1, providing the negative resistor circuit 18 makes it possible to cancel out noises of the integration circuits 31 in the first stages in the loop filters 12A and 12B. In addition, providing the negative resistor circuit 18 with the chopper circuit 50 makes it possible to reduce low-frequency noise in the negative resistor circuit 18.

(About Operations of High-Pass Filters 17A and 17B)

Next, operations of the high-pass filters 17A and 17B are described in detail below with use of the high-pass filter 17A as an example.

FIG. 11 illustrates the operation of the high-pass filter 17A, where (A) indicates a waveform of an output signal of the predriver 15A, (B) indicates a waveform of the output signal SOP, (C) indicates a waveform of a feedback current flowing into the resistor 23 of the loop filter 12A, (D) indicates a waveform of a feedback current flowing into the high-pass filter 17A, and (E) indicates a waveform of a total current (a total feedback current) of the feedback current flowing into the resistor 23 of the loop filter 12A and the feedback current flowing into the high-pass filter 17A.

At a timing t31, the predriver 15A changes the output signal from the high level to the low level ((A) of FIG. 11). The driver 16A changes the output signal SOP from the low level to the high level on the basis of this signal ((B) of FIG. 11). Accordingly, a current flowing into the resistor 23 of the loop filter 12A increases ((C) of FIG. 11).

At this time, the dummy predriver 45A changes an output signal from the high level to the low level, as with the predriver 15A ((A) of FIG. 11). Transition of this output signal is transition opposite to transition of the output signal SOP from the low level to the high level. The current flowing into the high-pass filter 17A transiently decreases at the timing t31 in response to this transition, and thereafter returns toward "0" ((D) of FIG. 11).

As a result, the total current (the total feedback current) of the feedback current flowing into the resistor 23 of the loop filter 12A ((C) of FIG. 11) and the feedback current flowing into the high-pass filter 17A ((D) of FIG. 11) does not increase abruptly, but increases mildly at the timing t31, as illustrated in (E) of FIG. 11. The total feedback current is added to an input current of the integration circuit 31 of the loop filter 12A.

Thereafter, at a timing t32, the predriver 15A changes the output signal from the low level to the high level ((A) of FIG. 11). The driver 16A changes the output signal SOP from the high level to the low level on the basis of this signal ((B) of FIG. 11). Accordingly, the current flowing into the resistor 23 of the loop filter 12A decreases ((C) of FIG. 11).

At this time, the dummy predriver 45A changes the output signal from the low level to the high level, as with the predriver 15A ((A) of FIG. 11). Transition of this output signal is transition opposite to transition of the output signal SOP from the high level to the low level ((B) of FIG. 11). The current flowing into the high-pass filter 17A transiently increases at the timing t32 in response to this transition, and thereafter returns toward "0" ((D) of FIG. 11).

As a result, the total current (the total feedback current) of the feedback current flowing into the resistor 23 of the loop filter 12A ((C) of FIG. 11) and the feedback current flowing into the high-pass filter 17A ((D) of FIG. 11) does not decrease abruptly, but decreases mildly at the timing t32, as illustrated in (E) of FIG. 11. The total feedback current is added to the input current of the integration circuit 31 of the loop filter 12A.

Thus, in the amplifier circuit 1, it is possible to prevent the input currents of the integration circuits 31 of the loop filters 12A and 12B from abruptly changing. This makes it possible to reduce a possibility that signal distortion occurs resulting from a slew rate of the integration circuit 31. In other words, for example, in a case where the high-pass filters 17A and 17B are not provided, the current illustrated in (C) of FIG. 11 is added to the input current of the integration circuit 31 of the loop filter 12A; therefore, there is a possibility that this input current abruptly changes. In this case, in the integration circuit 31, there is a possibility that nonlinear slew rate response is caused and signal distortion occurs. In contrast, in the amplifier circuit 1, the high-pass filters 17A and 17B are provided, which makes it possible to prevent the input currents of the integration circuits 31 of the loop filters 12A and 12B from abruptly changing. This makes it possible to reduce a possibility that signal distortion occurs.

Thus, in the amplifier circuit 1, a first loop filter (the loop filter 12A) and a second loop filter (the loop filter 12B) are provided. The first loop filter (the loop filter 12A) includes a first former-stage integration circuit (the integration circuit 31), a first inverter circuit (the inverter circuit 32), and a first latter-stage integration circuit (the integration circuit 33). The first former-stage integration circuit (the integration circuit 31) receives a first current (the current Ip) and a current corresponding to a first output signal (the output signal SOP) and is able to perform an integral action. The first inverter circuit (the inverter circuit 32) is able to invert an output signal of the first former-stage integration circuit (the integration circuit 31). The first latter-stage integration circuit (the integration circuit 33) is able to generate a first signal (the signal S1A) by receiving an output signal of the first inverter circuit (the inverter circuit 32) and the first output signal and performing an integral action. The second loop filter (the loop filter 12B) includes a second former-stage integration circuit (the integration circuit 31), a second inverter circuit (the inverter circuit 32), and a second latter-stage integration circuit (the integration circuit 33). The second former-stage integration circuit (the integration circuit 31) receives a second current (the current Im) and a current corresponding to a second output signal (the output signal SOM) and is able to perform an integral action. The second inverter circuit (the inverter circuit 32) is able to invert an output signal of the second former-stage integration circuit (the integration circuit 31). The second latter-stage integration circuit (the integration circuit 33) is able to generate a second signal (the signal S1B) by receiving an output signal of second inverter circuit (the inverter circuit 32) and the second output signal (the output signal SOM) and performing an integral action. Accordingly, in the amplifier circuit 1, it is possible to reduce a possibility that crossover distortion occurs, and it is possible to effectively reduce signal distortion by a high open loop gain.

In addition, the amplifier circuit 1, the negative resistor circuit 18 that is able to operate as a circuit having a negative resistance value is provided, which makes it possible to cancel out noises of the integration circuits 31 in first stages in the loop filters 12A and 12B.

In addition, in the amplifier circuit 1, a first circuit (the dummy predriver 45A) and a first high-pass filter (the high-pass filter 17A) are provided. The first circuit (the dummy predriver 45A) generates a first feedback signal corresponding to an inverted signal of the first output signal (the output signal SOP), and the first high-pass filter (the high-pass filter 17A) allows a high-frequency component of the first feedback signal to pass therethrough. The first former-stage integration circuit (the integration circuit 31) performs an integral action on the basis of the first current (the current Ip), the current corresponding to the first output signal (the output signal SOP), and an output current of the first high-pass filter (the high-pass filter 17A). In addition, a second circuit (the dummy predriver 45B) and a second high-pass filter (the high-pass filter 17B) are provided. The second circuit (the dummy predriver 45B) generates a second feedback signal corresponding to an inverted signal of the second output signal (the output signal SOM), and the second high-pass filter (the high-pass filter 17B) allows a high-frequency component of the second feedback signal to pass therethrough. The second former-stage integration circuit (the integration circuit 31) performs an integral action on the basis of the second current (the current Im), the current corresponding to the second output signal (the output signal SOM), and an output current of the second high-pass filter (the high-pass filter 17B). Accordingly, in the amplifier circuit 1, it is possible to reduce a possibility that signal distortion resulting from a nonlinear slew rate response occurs.

Effects

As described above, in the present embodiment, the amplifier circuit 1 includes the first loop filter and the second loop filter. The first loop filter includes the first former-stage integration circuit, the first inverter circuit, and the first latter-stage integration circuit. The first former-stage integration circuit receives the first current (the current Ip) and the current corresponding to the first output signal, and is able to perform an integral action. The first inverter circuit is able to invert the output signal of the first former-stage integration circuit. The first latter-stage integration circuit is able to generate the first signal by receiving the output signal of the first inverter circuit and the first output signal and performing an integral action. The second loop filter includes the second former-stage integration circuit, the second inverter circuit, and the second latter-stage integration circuit. The second former-stage integration circuit receives the second current and the current corresponding to the second output signal, and is able to perform an integral action. The second inverter circuit is able to invert the output signal of the second former-stage integration circuit. The second latter-stage integration circuit is able to generate the second signal by receiving the output signal of the second inverter circuit and the second output signal and performing an integral action. Accordingly, it is possible to reduce signal distortion.

Modification Example 1

In the embodiment described above, the negative resistor circuit 18 is provided, but this is not limitative. Instead of this, for example, as with an amplifier circuit 1A illustrated in FIG. 12, the negative resistor circuit 18 may not be provided.

Modification Example 2

In the embodiment described above, the dummy predrivers 45A and 45B and the high-pass filters 17A and 17B are provided, but this is not limitative. Instead of this, for example, as with an amplifier circuit 1B illustrated in FIG. 13, the dummy predrivers 45A and 45B and the high-pass filters 17A and 17B may not be provided.

The present technology has been described above with reference to the embodiment and the modification examples, but the present technology is not limited to the embodiment and the like, and may be modified in a variety of ways.

For example, as with an amplifier circuit 1C illustrated in FIG. 14, the negative resistor circuit 18, the dummy predrivers 45A and 45B, and the high-pass filters 17A and 17B may not be provided.

It is to be noted that the effects described herein are merely illustrative and non-limiting, and other effects may be provided.

It is to be noted that the present technology may have the following configurations. According to the present technology having the following configurations, it is possible to reduce signal distortion.

(1)

An amplifier circuit including:

an input circuit that is configured to generate a differential current including a first current and a second current on the basis of an input signal;

a first loop filter including a first former-stage integration circuit, a first inverter circuit, and a first latter-stage integration circuit, the first former-stage integration circuit configured to perform an integral action on the basis of the first current and a current corresponding to a first output signal, the first inverter circuit configured to invert an output signal of the first former-stage integration circuit, and the first latter-stage integration circuit configured to generate a first signal by performing an integral action on the basis of an output signal of the first inverter circuit and the first output signal;

a first modulation circuit that is configured to generate a first modulated signal by modulating the first signal with use of a predetermined signal;

a first output circuit that is configured to generate the first output signal on the basis of the first modulated signal;

a second loop filter including a second former-stage integration circuit, a second inverter circuit, and a second latter-stage integration circuit, the second former-stage integration circuit configured to perform an integral action on the basis of the second current and a current corresponding to a second output signal, the second inverter circuit configured to invert an output signal of the second former-stage integration circuit, and the second latter-stage integration circuit configured to generate a second signal by performing an integral action on the basis of an output signal of the second inverter circuit and the second output signal;

a second modulation circuit that is configured to generate a second modulated signal by modulating the second signal with use of the predetermined signal; and a second output circuit that is configured to generate the second output signal on the basis of the second modulated signal.

(2)

The amplifier circuit according to (1), further including a negative resistor circuit that is configured to operate as a circuit having a negative resistance value, in which the input circuit causes the first current and the second current to flow into a first node and a second node, the first former-stage integration circuit is coupled to the first node, the second former-stage integration circuit is coupled to the second node, and the negative resistor circuit is provided between the first node and the second node.

(3)

The amplifier circuit according to (2), in which the negative resistor circuit includes a first terminal coupled to the first node, a second terminal coupled to the second node, a first transistor having a gate configured to be coupled to the first terminal, and a drain configured to be coupled to the second terminal, and a second transistor having a gate configured to be coupled to the second terminal, and a drain configured to be coupled to the first terminal.

(4)

The amplifier circuit according to any one of (1) to (3), further including:

a first circuit that is configured to generate a first feedback signal corresponding to an inverted signal of the first output signal;

a first high-pass filter that is configured to allow a high-frequency component of the first feedback signal to pass therethrough;

a second circuit that is configured to generate a second feedback signal corresponding to an inverted signal of the second output signal; and a second high-pass filter that is configured to allow a high-frequency component of the second feedback signal to pass therethrough, in which the first former-stage integration circuit is configured to perform the integral action on the basis of the first current, the current corresponding to the first output signal, and an output current of the first high-pass filter, and the second former-stage integration circuit is configured to perform the integral action on the basis of the second current, the current corresponding to the second output signal, and an output current of the second high-pass filter.

(5)

The amplifier circuit according to any one of (1) to (4), in which the input circuit causes the first current and the second current to flow into a first node and a second node, the first former-stage integration circuit includes a first operational amplifier circuit having a positive input terminal, a negative input terminal coupled to the first node, and an output terminal, a first capacitor having a first terminal coupled to the negative input terminal of the first operational amplifier circuit, and a second terminal coupled to the output terminal of the first operational amplifier circuit, and a first resistor having a first terminal to be supplied with the first output signal, and a second terminal coupled to the negative input terminal of the first operational amplifier circuit, and the second former-stage integration circuit includes a second operational amplifier circuit having a positive input terminal, a negative input terminal coupled to the first node, and an output terminal, a second capacitor having a first terminal coupled to the negative input terminal of the second operational amplifier circuit, and a second terminal coupled to the output terminal of the first operational amplifier circuit, and a second resistor having a first terminal to be supplied with the second output signal, and a second terminal coupled to the negative input terminal of the second operational amplifier circuit.

This application claims the benefits of Japanese Priority Patent Application JP2021-113811 filed with the Japan Patent Office on Jul. 8, 2021, the entire contents of which are incorporated herein by reference.

It should be understood that those skilled in the art could conceive various modifications, combinations, sub-combinations, and alterations depending on design requirements and other factors, insofar as they are within the scope of the appended claims or the equivalents thereof.

The invention claimed is:

1. An amplifier circuit comprising:

an input circuit that is configured to generate a differential current including a first current and a second current on a basis of an input signal;

a first loop filter including a first former-stage integration circuit, a first inverter circuit, and a first latter-stage integration circuit, the first former-stage integration circuit configured to perform an integral action on a basis of the first current and a current corresponding to a first output signal, the first inverter circuit configured to invert an output signal of the first former-stage integration circuit, and the first latter-stage integration circuit configured to generate a first signal by performing an integral action on a basis of an output signal of the first inverter circuit and the first output signal;

a first modulation circuit that is configured to generate a first modulated signal by modulating the first signal with use of a predetermined signal;

a first output circuit that is configured to generate the first output signal on a basis of the first modulated signal;

a second loop filter including a second former-stage integration circuit, a second inverter circuit, and a second latter-stage integration circuit, the second former-stage integration circuit configured to perform an integral action on a basis of the second current and a current corresponding to a second output signal, the second inverter circuit configured to invert an output signal of the second former-stage integration circuit, and the second latter-stage integration circuit configured to generate a second signal by performing an integral action on a basis of an output signal of the second inverter circuit and the second output signal;

a second modulation circuit that is configured to generate a second modulated signal by modulating the second signal with use of the predetermined signal; and a second output circuit that is configured to generate the second output signal on a basis of the second modulated signal.

2. The amplifier circuit according to claim 1, further comprising a negative resistor circuit that is configured to operate as a circuit having a negative resistance value, wherein the input circuit causes the first current and the second current to flow into a first node and a second node, the first former-stage integration circuit is coupled to the first node, the second former-stage integration circuit is coupled to the second node, and the negative resistor circuit is provided between the first node and the second node.

3. The amplifier circuit according to claim 2, wherein the negative resistor circuit includes a first terminal coupled to the first node, a second terminal coupled to the second node, a first transistor having a gate configured to be coupled to the first terminal, and a drain configured to be coupled to the second terminal, and a second transistor having a gate configured to be coupled to the second terminal, and a drain configured to be coupled to the first terminal.

4. The amplifier circuit according to claim 1, further comprising:

a first circuit that is configured to generate a first feedback signal corresponding to an inverted signal of the first output signal;

a first high-pass filter that is configured to allow a high-frequency component of the first feedback signal to pass therethrough;

a second circuit that is configured to generate a second feedback signal corresponding to an inverted signal of the second output signal; and a second high-pass filter that is configured to allow a high-frequency component of the second feedback signal to pass therethrough, wherein the first former-stage integration circuit is configured to perform the integral action on a basis of the first current, the current corresponding to the first output signal, and an output current of the first high-pass filter, and the second former-stage integration circuit is configured to perform the integral action on a basis of the second current, the current corresponding to the second output signal, and an output current of the second high-pass filter.

5. The amplifier circuit according to claim 1, wherein the input circuit causes the first current and the second current to flow into a first node and a second node, the first former-stage integration circuit includes a first operational amplifier circuit having a positive input terminal, a negative input terminal coupled to the first node, and an output terminal, a first capacitor having a first terminal coupled to the negative input terminal of the first operational amplifier circuit, and a second terminal coupled to the output terminal of the first operational amplifier circuit, and a first resistor having a first terminal to be supplied with the first output signal, and a second terminal coupled to the negative input terminal of the first operational amplifier circuit, and the second former-stage integration circuit includes a second operational amplifier circuit having a positive input terminal, a negative input terminal coupled to the first node, and an output terminal, a second capacitor having a first terminal coupled to the negative input terminal of the second operational amplifier circuit, and a second terminal coupled to the output terminal of the first operational amplifier circuit, and a second resistor having a first terminal to be supplied with the second output signal, and a second terminal coupled to the negative input terminal of the second operational amplifier circuit.

* * * * *